United States Patent [19]

Abe et al.

[11] Patent Number: 5,020,072
[45] Date of Patent: May 28, 1991

[54] SEMICONDUCTOR LASER DEVICE

[75] Inventors: Yuji Abe; Hiroshi Sugimoto; Kenichi Ohtsuka; Toshiyuki Oishi; Teruhito Matsui, all of Amagasaki, Japan

[73] Assignee: Mitsubishi Denki Kabushiki Kaisha, Japan

[21] Appl. No.: 401,745

[22] Filed: Sep. 1, 1989

[30] Foreign Application Priority Data

May 22, 1989 [JP] Japan .................. 1-129346

[51] Int. Cl.$^5$ ............................ H01S 3/08
[52] U.S. Cl. ................. 372/96; 372/45; 372/102
[58] Field of Search ............. 372/96, 45, 102, 46

[56] References Cited

U.S. PATENT DOCUMENTS

| 4,716,132 | 12/1987 | Hirata | 372/96 |
| 4,782,035 | 11/1988 | Fujiwara | 437/129 |
| 4,786,951 | 11/1988 | Tokuda et al. | 357/17 |
| 4,847,857 | 7/1989 | Ohkura | 372/96 |

FOREIGN PATENT DOCUMENTS

| 0187718 | 7/1986 | European Pat. Off. | |
| 0158989 | 9/1983 | Japan | 372/96 |
| 0065588 | 4/1985 | Japan | 372/96 |
| 0247986 | 12/1985 | Japan | 372/96 |
| 0213383 | 9/1988 | Japan | 372/96 |
| 2111743 | 7/1983 | United Kingdom | |

OTHER PUBLICATIONS

Itaya et al., "New 1.5 μm ... Wavelength ... Laser", Electronics Letters, Nov. 1982, vol. 18, No. 23, pp. 1006–1008.

Primary Examiner—Georgia Epps
Attorney, Agent, or Firm—Leydig, Voit & Mayer

[57] ABSTRACT

A semiconductor laser device includes an active layer, a first semiconductor layer having a larger energy band gap than the active layer, a diffraction grating layer having a larger energy band gap than the active layer and a smaller energy band gap than the first semiconductor layer, and a second semiconductor layer having the same composition as the first semiconductor layer, successively grown on the active layer, parallel stripe grooves of predetermined period reaching the first semiconductor layer produced at the entire surface of the grown layers, a cladding layer having the same composition as the first semiconductor layer which is re-grown thereon, and a diffraction grating constituted by the remainder of the diffraction grating layer. The coupling coefficient of the light is determined by the film thickness of a layer produced between the active layer and the diffraction grating layer, and the amplitude of the diffraction grating is determined by the layer thickness of the diffraction grating layer. Therefore, the coupling coefficient can be set at a design value at high precision and at high reproducibility.

11 Claims, 13 Drawing Sheets

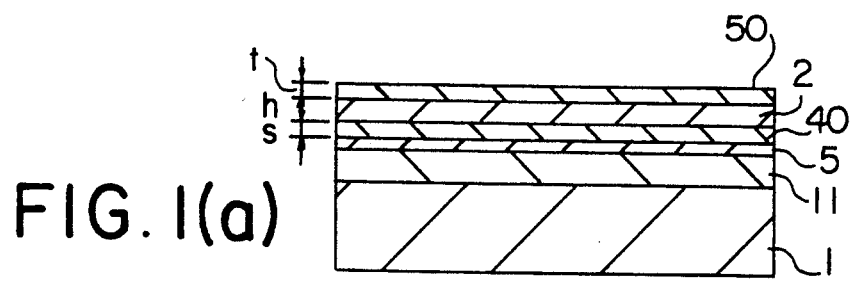
FIG. 1(a)
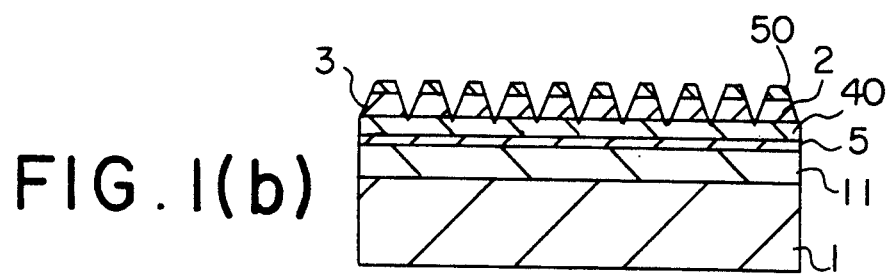
FIG. 1(b)
FIG. 1(c)
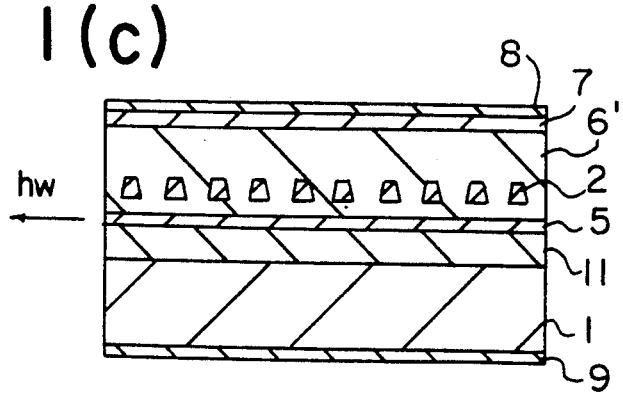

FIG. 3(a)
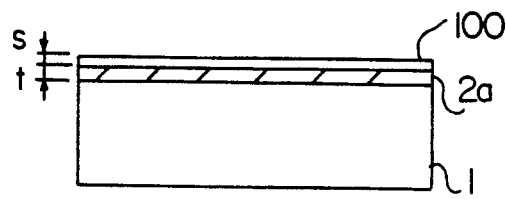
FIG. 3(b)
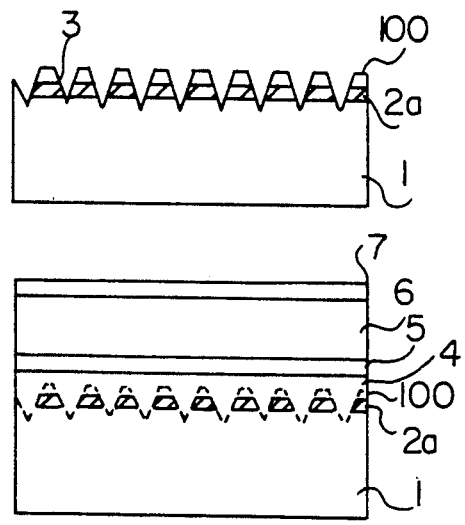
FIG. 3(c)
FIG. 3(d)
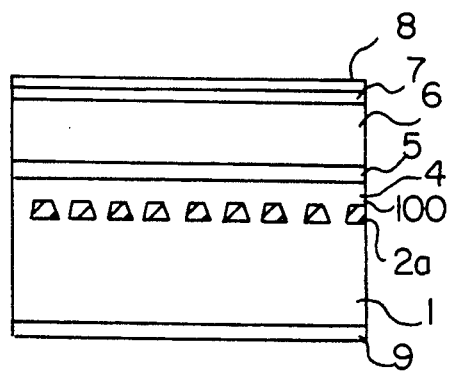

FIG. 6(a)
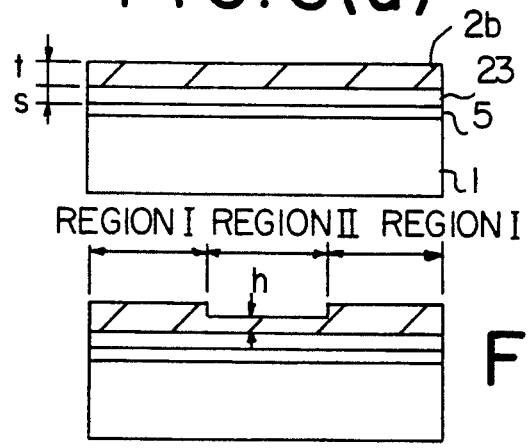
FIG. 6(b)
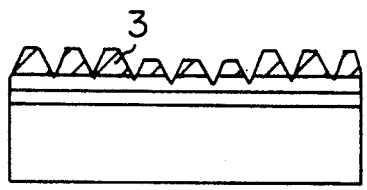
FIG. 6(c)
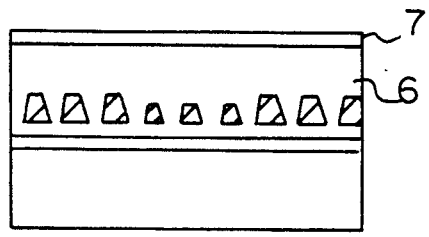
FIG. 6(d)
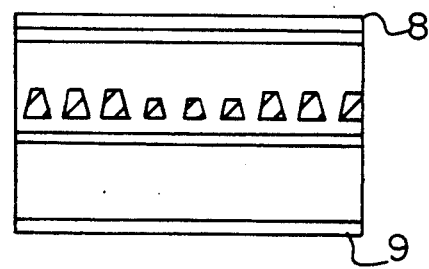
FIG. 6(e)

FIG. 7(a)
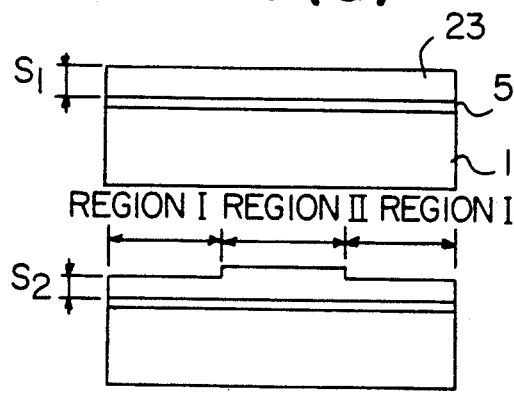
FIG. 7(b)
FIG. 7(c)
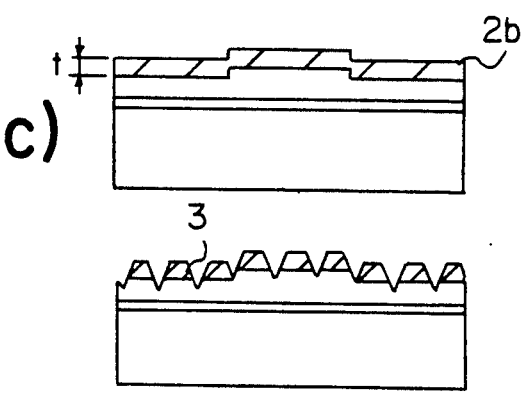
FIG. 7(d)
FIG. 7(e)
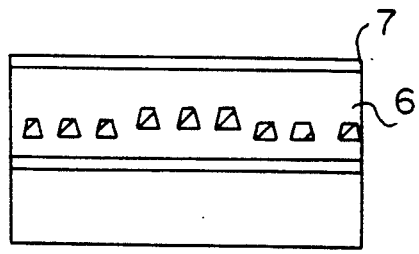
FIG. 7(f)
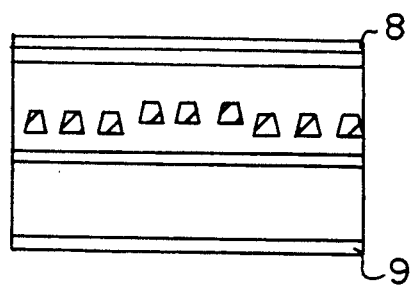

FIG. 8(e)
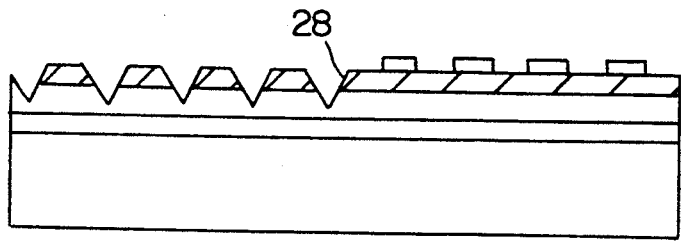
FIG. 8(f)
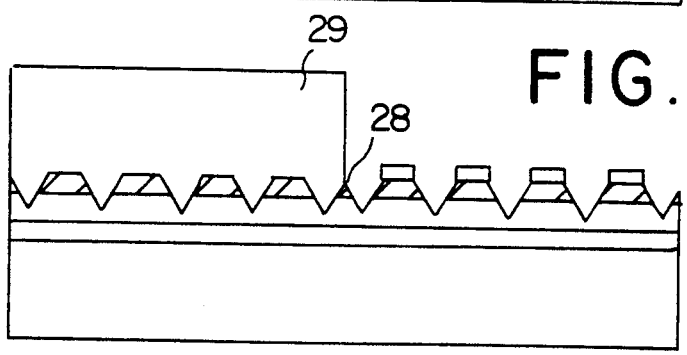
FIG. 8(g)
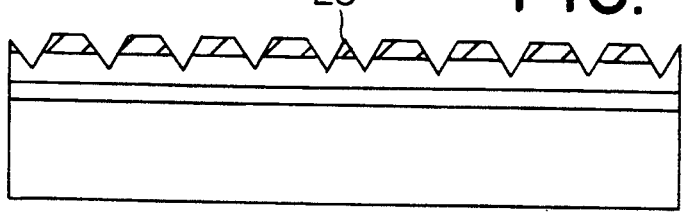
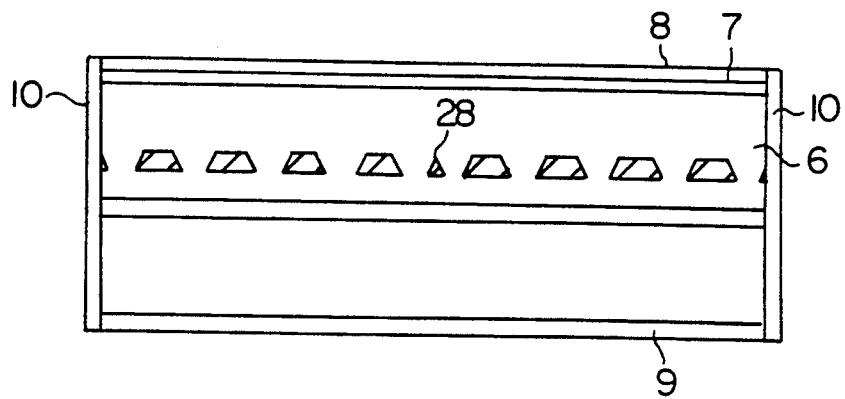
FIG. 8(h)

FIG. 14(a) (PRIOR ART)
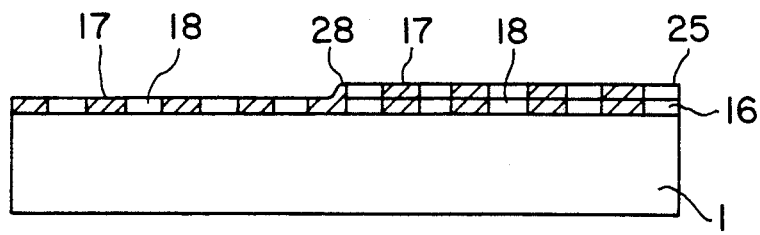
FIG. 14(b) (PRIOR ART)
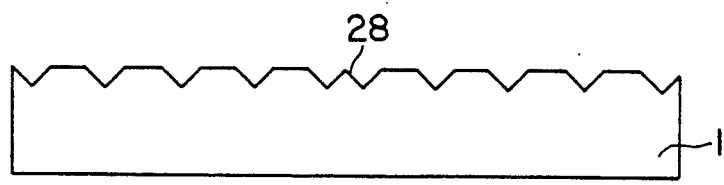
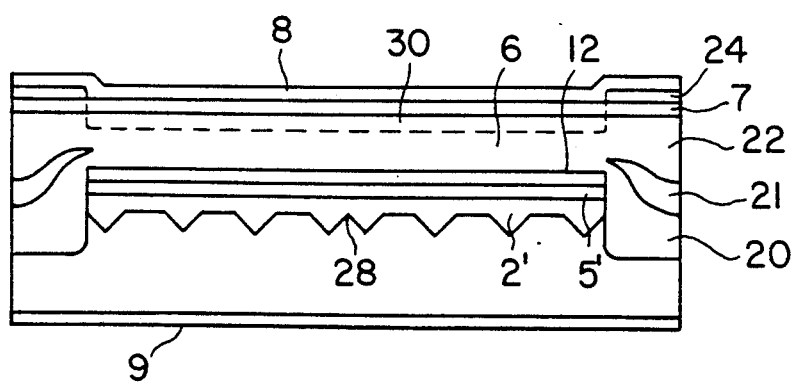
FIG. 14(c) (PRIOR ART)

SEMICONDUCTOR LASER DEVICE

FIELD OF THE INVENTION

The present invention relates to a semiconductor laser device and, more particularly, to a device that has a diffraction grating, the light coupling coefficient of which is reproducibly established.

BACKGROUND OF THE INVENTION

FIG. 10 shows, in cross-section, a distributed feedback type (hereinafter referred to as DFB) semiconductor laser device as disclosed in Electronics Letters, Volume 18, Number 23, page 1006 (1982) by Y. Itaya et al. In FIG. 10, reference numeral 1 designates an n type InP substrate. N type InP cladding layer 11 is disposed on the substrate 1. N type InGaAsP active layer 5 is disposed on the cladding layer 11. P type InGaAsP diffraction grating layer 2' is disposed on the active layer 5. P type InP cladding layer 6 is disposed on the diffraction grating layer 2'. P+ type InGaAsP contact layer 7 is disposed on the cladding layer 6. P side electrode 8 is disposed on the contact layer 7 and n side electrode 9 is disposed on the rear surface of the substrate 1. Reference numeral 3 designates a diffraction grating produced by varying the layer thickness of the diffraction grating layer 2' to produce a concavo-convex surface on that layer 2' adjacent the cladding layer 6.

When a forward direction bias is applied between the p side electrode 8 and n side electrode 9, holes are injected from the p side electrode 8 and electrons are injected from the n side electrode 9, and they recombine at the active layer 5 to generate light. This device has a waveguide structure in which the active layer 5 and the diffraction grating layer 2', both having relatively large refractive indices, are disposed between n type InP cladding layer 11 and p type InP cladding layer 6 having relatively low refractive indices. The emitted light is transmitted in the active layer 5, the diffraction grating layer 2', and the neighborhood thereof in a direction parallel to those layers. Furthermore, since the diffraction grating 3 is produced on the diffraction grating layer 2', there is a periodic variation of effective refractive index in the direction of the diffraction grating 3. If the period of the diffraction grating 3 is made equal to the period at which the generated light undergoes Bragg reflection, only light having a wavelength that satisfies the Bragg reflection condition is repeatedly reflected in the waveguide structure and produces oscillations.

FIG. 11 shows a cross-sectional view of a phase-shift DFB semiconductor laser device as disclosed in Electronics Letters, Volume 20, Number 24, pages 1016–1018 (1984) by H. Soda et al, and FIG. 12 shows a perspective view thereof. In this figure, reference numeral 5' designates an InGaAsP active layer, reference numeral 10 designates an anti-reflection film, reference numeral 12 designates an n type InGaAsP guiding layer, and reference numerals 13 and 14 designate a p type and n type InP buried layer, respectively.

When a forward bias is applied between the p side electrode 8 and n side electrode 9, holes are injected from the p side electrode 8 and electrons are injected from the n side electrode 9, and they recombine at the active layer 5' to generate light. This device has a waveguide structure in which the active layer 5' and the guiding layer 12, both having relatively large refractive indices, are disposed in the layer thickness direction, the n type InP substrate 1 and the p type InP cladding layer 6 both having relatively low refractive indices. The active layer 5' is disposed between the p type InP cladding layers 13 or n type InP cladding layers 14 in the transverse direction. The emitted light is transmitted in the active layer 5, the guiding layer 12, and the neighborhood thereof in the stripe direction. Furthermore, since the diffraction grating 3 is disposed on the substrate 1, there is a periodic variation in the thickness of the guiding layer 12. Therefore, there is a periodic variation in the equivalent refractive index. If the period of the diffraction grating 3 is made equal to the period at which the generated light is Bragg reflected, only the light of a wavelength that satisfies the Bragg reflection condition is repeatedly reflected in the waveguide structure and produces oscillations. However, a semiconductor laser device having such a constant period diffraction grating does not actually oscillate at the Bragg wavelength. It oscillates at two wavelengths shifted slightly toward the long and short wavelength side, respectively, from the Bragg wavelength. In order to oscillate at a single wavelength, it is sufficient to shift the phase of the light by $\pi/2$ upon its return to a central portion of the element after reflection. In this prior art example, as shown by FIG. 12, the width of the central portion of stripe having length l is widened. By widening the stripe width, the equivalent refractive index of that portion is differentiated from that of the other portion. When the variation quantity $\Delta\beta$ of the propagation constant is selected so that $\Delta\beta l = \pi/b\ 2$, the light is shifted by $\pi/2$ while being transitting the broad width stripe portion, thereby producing a single wavelength oscillation.

FIG. 14(c) shows, in cross-section, a $\lambda/4$ shifted DFB semiconductor laser as disclosed in Electronics Letters, Volume 20, Number 24, pages 1008–1010, by K. Utaka et al. FIGS. 14(a) and 14(b) show a production process and FIG. 14(c) shows a completed device. In these figures, reference numeral 1 designates an n type InP substrate. A negative photoresist film 16 is disposed on the substrate 1. Reference numeral 28 designates a $\lambda/4$ shift position. A positive photoresist film 25 is disposed on the negative photoresist film 16. Reference numerals 17 and 18 designate a light exposed portion and non-exposed portion, respectively, of the photoresist film 25. Reference numeral 2' designates an n type InGaAsP diffraction grating layer and reference numeral 5' designates an InGaAsP active layer. Reference numeral 12 designates a p type InGaAsP guiding layer and reference numeral 6 designates a p type InP cladding layer. Reference numeral 20 designates a p type InP first buried layer, reference numeral 21 designates an n type InP second buried layer, and reference numeral 22 designates a p type InP third buried layer. Reference numeral 7 designates a p+ type InGaAsP contact layer, reference numeral 24 designates a silicon dioxide film, and reference numeral 30 designates a zinc diffusion region. Reference numerals 8 and 9 designate a p side electrode and an n side electrode, respectively.

A negative photoresist 16 is deposited on the n type InP substrate 1, and the photoresist 16 at the left side of the $\lambda/4$ shift position 28 is removed. A positive photoresist 25 is deposited on the entire surface and exposed with light interference fringes to produce alternating exposed portions 17 and non-exposed portions 18. First, development of the positive photoresist 25 is carried out. The positive photoresist 25, after development, is used as an etching mask to etch the n type InP substrate 1. Thereafter, the positive photoresist 25 is removed and development of the negative photoresist 16 is carried out. The left side of the λ/4 shift position 28 is covered by other photoresist and the n type InP substrate 1 at the right side of the λ/4 shift position 28 is etched using the negative side photoresist 16 as an etching mask. Since the positive photoresist and the negative photoresist have inverted photosensitive characteristics, a diffraction grating having inverted phases to the left and right of the λ/4 shift position 28 is obtained.

Next, an n type InGaAsP diffraction grating layer 2', an InGaAsP active layer 5', a p type InGaAsP guiding layer 12, and a p type InP cladding layer 6 are grown. The neighborhoods of both facets are buried by the p type InP first buried layer 20, the n type InP second buried layer 21, and the p type InP third buried layer 22. The p+ type InGaAsP contact layer 7 is grown on the entire surface. Finally, an SiO₂ film 24 for confining the current is produced and zinc 30 is diffused to reduce the contact resistance. A p side electrode 8 and an n side electrode 9 are vapor deposited to complete the laser element.

When a forward direction bias is applied between the p side electrode 8 and the n side electrode 9, holes are injected from the p side electrode 8 and electrons are injected from the n side electrode 9 and recombine at the active layer 5' to generate light. Since this device has a waveguide structure in which the active layer 5', the diffraction grating layer 2', and the guiding layer 12, all relatively having large refractive indices, are disposed between the n type Inp substrate 1 and the p type InP cladding layer 6, both having relatively low refractive indices, the emitted light transits the active layer 5', the diffraction grating layer 2', the guiding layer 12, and the neighborhood thereof in the stripe direction. Furthermore, since the thickness of the diffraction grating layer 2' varies periodically, there is also a periodic variation in the equivalent refractive index. If the period of the diffraction grating 3 is made equal to the period at which the generated light undergoes Bragg reflection, only the light of a wavelength that satisfies the Bragg reflection condition is repeatedly reflected in the waveguide structure. Further, the phase of the diffraction grating 3 is inverted at the center of the resonator and, thus, a single wavelength oscillation occurs. The buried layer at the laser facet prevents reflections.

In the prior art DFB semiconductor laser device of FIG. 10, the diffraction grating is usually produced by etching after growing a cladding layer 6, an active layer 5, and a diffraction grating layer 2' on the semiconductor substrate 1. Thus, the distance between the diffraction grating and the active layer depends on the depth of etching. When a cladding layer is regrown on the diffraction grating, the diffraction grating is partly dissolved, i.e., melted back, which reduces the amplitude of the diffraction grating. The melting back makes control of the coupling coefficient, i.e., the degree of the distributed feedback, difficult.

In the prior art phase shift DFB semiconductor laser device of FIGS. 11 and 12, in order to obtain desired characteristics, the stripe width of the active layer has to be precisely controlled and difficulties in achieving this control produced low yields.

Furthermore, in the prior art DFB semiconductor laser device of FIG. 10, the coupling coefficient representing the intensity of the distributed feedback is uniform in the resonator direction. The light intensity distribution in the resonator is increased in the neighborhood of the center as shown by A in FIG. 13. Therefore, there arises a so-called axial direction spatial hole burning at high power output operation, causing an instability in the mode of oscillation and preventing the achievement of narrow line widths.

Further, in the prior art λ/4 shift DFB laser device of the above-described construction, in order to produce a diffraction grating having an inverted phase, the interference fringe exposure requires the use of both negative and positive resists. In order to produce diffraction gratings on the left and right of the λ/4 shift position, an etching step, in which depth and the etched configuration are difficult to control and which can affect laser element characteristics, must be carried out.

SUMMARY OF THE INVENTION

It is an object of the present invention to provide a distributed feedback type semiconductor laser device reliably reproducing a coupling coefficient at a design value.

It is another object of the present invention to provide a phase shift DFB semiconductor laser device in which the phase shift is precisely controlled.

It is another object of the present invention to provide a narrow line width DFB semiconductor laser device in which the oscillation mode is stable even at high power output operation.

It is another object of the present invention to provide a λ/4 shift DFB semiconductor laser device in which a diffraction grating pattern of inverted phase is produced by interference exposure of a single kind of photoresist and which avoids the influence of the etching depth of the diffraction grating on laser characteristics.

Other objects and advantages of the present invention will become apparent from the detailed description given hereinafter. It should be understood, however, that the detailed description and specific embodiments are given by way of illustration only, since various changes and modifications within the spirit and scope of the invention will become apparent to those skilled in the art from this detailed description.

According to an aspect of the present invention, in a semiconductor laser a first semiconductor layer having a larger energy band gap than the active layer, a diffraction grating layer having a larger energy band gap than the active layer and a smaller energy band gap than the first semiconductor layer, and a second semiconductor layer of the same composition as the first semiconductor layer are successively grown on the active layer. Thereafter, parallel stripe grooves of predetermined period reaching the first semiconductor layer are produced on the entire surface, and a cladding layer of the same composition as the first semiconductor layer is regrown.

According to another aspect of the present invention, a diffraction grating layer having a lower energy band gap than the substrate is grown on the substrate, parallel stripe grooves of a predetermined period reaching the substrate are produced on the entire surface thereof. Thereafter, a barrier layer of the same composition as the substrate and an active layer having a smaller energy band gap than the diffraction grating layer are successively grown.

While the light coupling coefficient is mainly determined by the distance between the active layer and the diffraction grating and the amplitude of the diffraction grating, the distance between the active layer and the diffraction grating is only determined by the thickness of a layer disposed between the active layer and the diffraction grating layer. The amplitude of the diffraction grating is determined by the thickness of the diffraction grating layer. Therefore, the coupling coefficient can be established at a design value with high precision and reproducibility.

According to another aspect of the present invention, in a phase shift DFB laser device in which a barrier layer of the same composition as the cladding layer is disposed between the active layer and the diffraction grating layer, parallel stripe grooves of a predetermined period reaching the barrier layer are produced. Thereafter, the cladding layer is regrown and a diffraction grating is produced from the remainder of the diffraction grating layer. A region where the diffraction grating layer is removed or a region where the parallel stripe grooves are not produced is disposed at a portion on the direction of the diffraction grating.

Since the propagation coefficient of light at the region where the diffraction grating layer is removed or parallel stripe grooves are not produced is different from that of the other region, the phase shift which occurs when the light transits that region can be precisely controlled.

According to another aspect of the present invention, a barrier layer having a larger energy band gap than the active layer and a diffraction grating layer having a larger energy band gap than the active layer and smaller energy band gap than the barrier layer are successively grown on the active layer. Thereafter, parallel stripe grooves of predetermined period reaching the barrier layer are produced on the entire surface of the diffraction grating layer. Thereafter, a cladding layer of the same composition as the barrier layer is regrown thereon. The diffraction grating comprises the remainder of the diffraction grating layer, and the layer thickness of the barrier layer or the diffraction grating layer are varied depending on the position of the laser resonator length direction.

The coupling coefficient with light can be varied depending on the position of the resonator length direction and, thus, axial direction spatial hole burning can be suppressed and the mode of oscillation is stable, even at high output operation, and a narrow line width is obtained.

According to another aspect of the invention, a barrier layer of the same composition as the cladding layer is grown on the active layer, a diffraction grating layer is grown thereon, a diffraction grating pattern which is phase shifted is produced, etching is carried out to reach the barrier layer using the diffraction grating pattern as an etching mask, and a cladding layer is regrown thereon, thereby producing a semiconductor laser device.

Therefore, the depth of etching for producing the diffraction lattice will not affect the coupling coefficient and equivalent refraction index of an element whereby a highly efficient element can be readily reproduced.

BRIEF DESCRIPTION OF THE DRAWINGS

FIGS. 1(a) to 1(c) are sectional views of a production process for a semiconductor laser device according to a first embodiment of the present invention;

FIGS. 3(a) to 3(d) are sectional views of an alternative second embodiment;

FIGS. 6(a) to 6(e) are sectional views of a production process for a phase shift DFB semiconductor laser device according to a fourth embodiment of the present invention;

FIGS. 7(a) to 7(f) are sectional views of an alternative fourth embodiment;

FIGS. 8(a) to 8(h) are sectional views of a production process for a semiconductor laser device according to a fifth embodiment of the present invention;

FIGS. 14(a) to 14(c) are sectional views of a production process for a prior art semiconductor laser device.

DETAILED DESCRIPTION OF THE PREFERRED EMBODIMENTS

Figure 2A:
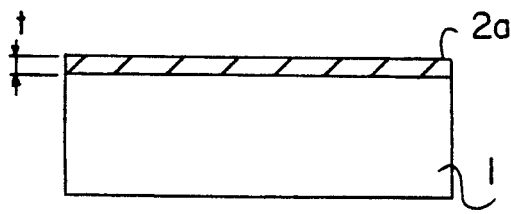
FIGS. 2(a) to 2(d) are sectional views of a production process for a semiconductor laser device according to a second embodiment of the present invention.

FIGS. 1(a) and 1(b) show a production process of a semiconductor laser device according to a first embodiment of the present invention and FIG. 1(c) is a cross-sectional view of a semiconductor laser device according to the first embodiment which is produced through the processes of FIGS. 1(a) and 1(b). In those figures, the same reference numerals designate the same elements as those shown in FIG. 10. Reference numeral 40 designates a p type InP layer and reference numeral 50 designates a p type InP deformation preventing layer.

An n type InP cladding layer 11, an n type InGaAsP active layer 5, a p type InP cladding layer 40, a p type InGaAsP diffraction grating layer 2, and a p type InP deformation preventing layer 50 are successively grown on an n type InP substrate 1. The thickness of the p type InP cladding layer 40 is assumed to be s, the thickness of the p type InGaAsP diffraction grating layer 2 is h, and the thickness of the p type InP deformation preventing layer is t. FIG. 1(a) shows a wafer in this state.

Next, a pattern is produced, for example, by illumination with interference fringes, and, thereafter, etching, for example, chemical etching, is carried out to a depth greater than (t+h) and less than (t+h+s), thereby producing a distributed feedback diffraction grating 3. The etching depth may be made (t+h) by selective etching. FIG. 1(b) shows a wafer in this state.

Thereafter, a p type cladding layer 6' and a p+ type InGaAsP contact layer 7 are grown, thereby completing the element shown in FIG. 1(c).

In such a DFB semiconductor laser, when a forward bias is applied between the p side electrode 8 and the n side electrode 9 in a manner similar to the prior art example, carriers are injected into the active layer 5 where they recombine to generate light. The semiconductor laser device of this embodiment also has a waveguide structure similar to the prior art example and, therefore, the generated light is transmitted in the direction parallel to the active layer 5. Furthermore, if the film thickness s of the p type InP layer 40 is sufficiently thin so that light leaks out to the diffraction grating layer 2, the light is subjected to variations in the effective refractive index due to the diffraction grating layer 2. Bragg reflection occurs, thereby leading to laser oscillation. While the coupling coefficient representing the ratio of the light that receives distributed feedback is determined mainly by the distance between the active layer 5 and the diffraction grating and the amplitude of the diffraction grating, the distance between the active layer 5 and the diffraction grating in this embodiment is determined by the thickness s of the p type InP layer 40. That thickness does not depend on the etching depth at the time of producing the diffraction grating, as in the prior art example. Furthermore, the deformation preventing layer 50 on the diffraction grating layer 2 has the same composition as the cladding layer 6' which is regrown and, therefore, the diffraction grating 3 produced by etching is kept as it is without melting back. Accordingly, the amplitude of the diffraction grating in this embodiment is the thickness h of the diffraction grating layer 2. By controlling the thicknesses of the p type InP layer 40 and of the diffraction grating layer 2, it is possible to establish the coupling coefficient at a design value with high reproducibility.

Figure 2B:
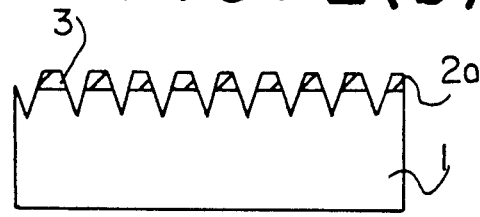
Figure 2C:
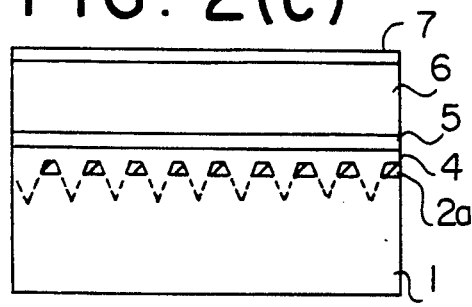
Figure 2D:
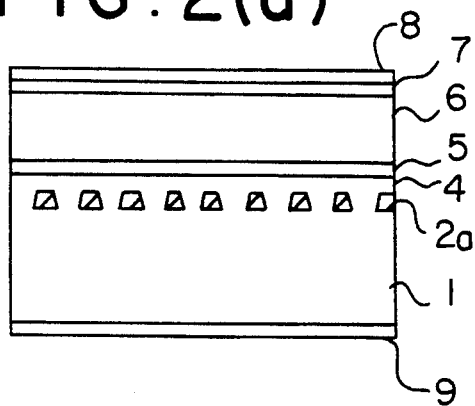

FIGS. 2(a) to 2(c) show a production process of a semiconductor laser device according to a second embodiment of the present invention, and FIG. 2(d) shows a cross-sectional view of a semiconductor laser device of the second embodiment produced through the processes of FIGS. 2(a) to 2(c). The same reference numerals designate the same elements as those shown in FIG. 10. Reference numeral 2a designates an n type InGaAsP diffraction grating layer and reference numeral 4 designates an n type InP barrier layer.

As shown in FIG. 2(a), an n type InGaAsP diffraction grating layer 2a is grown on the n type InP substrate 1. The thickness of the diffraction grating layer 2a is assumed to be t. Next, as shown in FIG. 2(b), a diffraction grating pattern is produced by illumination with interference fringes. Thereafter, etching, for example, chemical etching, is conducted to a depth greater than t and a distributed feedback type diffraction grating 3 is produced. Herein, the depth is controlled to be t by selective etching. Thereafter, as shown in FIG. 2(c), n type InP barrier layer 4, InGaAsP active layer 5, p type InP cladding layer 6, and p+ type InGaAsP contact layer 7 are grown. Finally, a p side electrode 8 and an n side electrode 9 are produced, thereby completing the device shown in FIG. 2(d).

In such a DFB semiconductor laser device, as in the prior art device, when a forward bias is applied between the p side electrode 8 and the n side electrode 9, carriers are injected into the active layer 5 where they recombine and generate light. Since this second embodiment also has a waveguide structure similar to the prior art device, the generated light is transmitted in the direction parallel to the active layer 5. Furthermore, if the layer thickness of the n type InP barrier layer 4 is sufficiently thin that light leaks out to the diffraction grating layer 2a, the light undergoes Bragg reflection because of the periodic variation of the equivalent refractive index and oscillates. The coupling coefficient indicating the ratio of the light that is fedback, which exerts a large influence on the oscillation characteristics, is determined mainly by the distance between the active layer 5 and the diffraction grating 3, and by the amplitude of the diffraction grating.

In this second embodiment, the distance between the active layer 5 and the diffraction grating 3 is determined by the thickness of the n type InP barrier layer 4 and does not depend on the etching depth at the time of production of the diffraction grating, as in the prior art. Furthermore, the amplitude of the diffraction grating is determined by the layer thickness t of the n type InGaAsP diffraction grating layer and does not depend on the etching depth at the time of production of the diffraction grating. Another important parameter in the DFB semiconductor laser is the controllability of the oscillation wavelength and obtaining oscillation at a single wavelength. This oscillation wavelength is determined by the period of the diffraction grating and the thicknesses of the active layer 5, the diffraction grating layer 2a, and the barrier layer 4. In the prior art example, the average thickness of the diffraction grating layer 2b depends largely on the etching depth and wavelength control is difficult. In this embodiment, however, the average thickness of the diffraction grating layer 2a does not depend so much on the etching depth and wavelength controllability is enhanced. In the prior art example, the oscillation characteristics are influenced by the variations in the grown film thicknesses and variations in the etching depth at the time of producing of diffraction grating. However, in this embodiment, the oscillation characteristics are affected only by variations in the grown film thicknesses and, thus, variations in the oscillation characteristics are reduced. Furthermore, since variations in the grown thicknesses can be controlled with a precision of several angstroms by using, for example, metal organic vapor phase epitaxy or molecular beam epitaxy, it is possible to control the oscillation characteristics with quite high precision by utilizing this embodiment.

In the above-described second embodiment, the n type InGaAsP diffraction grating layer may possibly be deformed while an n type InP barrier layer is grown on the diffraction grating. However, in an alternative embodiment shown in FIG. 3(a), etching of the diffraction grating is carried out to a depth greater than (s+t), as shown in FIG. 3(b), after growing an n type InP deformation preventing layer 100 to a film thickness s on the diffraction grating layer 2a. Thereafter, after, n type InP barrier layer 4, InGaAsP active layer 5, p type InP cladding layer 5, and p+ type InGaAsP contact layer 6 are grown as shown in FIG. 3(c). Thus, it is possible to prevent the deformation of the diffraction grating because the diffraction grating layer 2a is protected by the deformation preventing layer 100. FIGS. 3(d) shows, in cross-section, a semiconductor laser device completed through the above-described process.

Figure 4A:
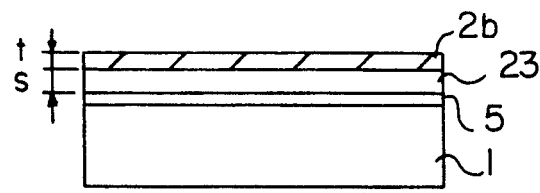
FIGS. 4(a) to 4(e) are sectional views of a production process for a phase shift DFB semiconductor laser device according to a third embodiment of the present invention.
Figure 4B:
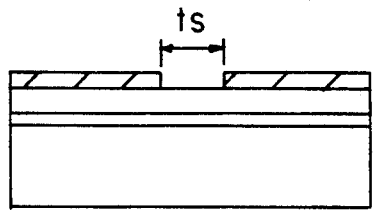
Figure 4C:
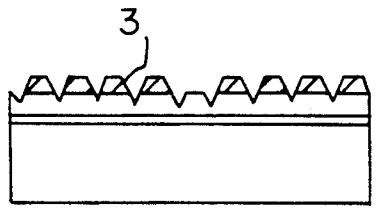
Figure 4D:
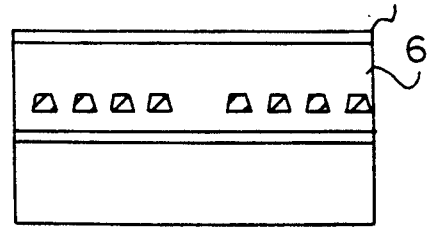
Figure 4E:
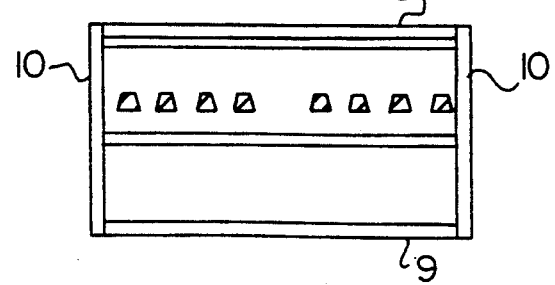

FIGS. 4(a) to 4(d) show a production process of a phase shift DFB semiconductor laser device according to a third embodiment of the present invention, and FIG. 4(e) shows a cross-sectional view of a phase shift DFB semiconductor laser device completed through the processes of FIGS. 4(a) to 4(d).

Figure 11:
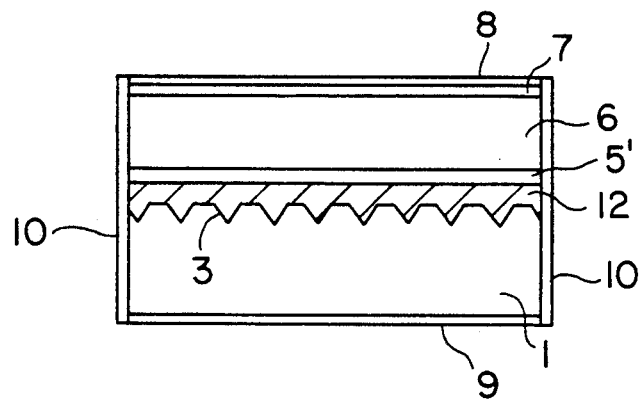
Figure 12:
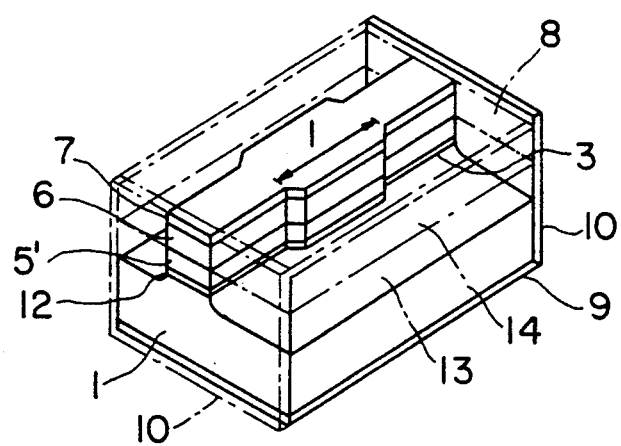

In these figures, the reference numerals designate the same or corresponding elements as those shown in FIG. 11. Reference numeral 23 designates a p type InP barrier layer and reference numeral 2b designates a p type InGaAsP diffraction grating layer.

As shown in FIG. 4(a), InGaAsP active layer 5 InP barrier layer 23, and p type InGaAsP diffraction grating layer 2b are successively grown on the n type InP substrate 1. The thickness of the p type InP barrier layer 23 is s and the thickness of the p type InGaAsP diffraction grating layer 2b is t. Herein, s>t.

As shown in FIG. 4(b), a region of length $l_2$ at the central portion of the diffraction grating layer 2b is removed. This region is hereinafter referred to as a phase shift region. Thereafter, a uniform diffraction grating pattern is produced by the interference fringe exposure method and etching is carried out such that the depth becomes larger than t and smaller than s, and, as shown in FIG. 4(c), a distributed feedback diffraction grating 3 is produced. Thereafter, a p type InP cladding layer 6 and a p+ type InGaAsP contact layer 7 are grown. Since the p type InP barrier layer 3 and the p type InP cladding layer 6 have the same composition, there is no diffraction grating stripe in the layer 4 at the phase shift region, as shown in FIG. 4(d). Finally, a p side electrode 8 and an n side electrode 9 are produced and reflection preventing films 10 are deposited on the facets, thereby completing the element shown in FIG. 4(e).

When a forward bias is applied between the p side electrode 8 and the n side electrode 9 in a manner similar to the prior art example, carriers are injected into the active layer 5 where they recombine and generate light. Because the phase shift DFB laser of this embodiment has a waveguide structure similar to the prior art example, the generated light is transmitted in the direction parallel to the active layer 5. If the thickness s of the barrier layer 5 is thin enough that light leaks out of the diffraction grating layer 2b at both sides of the phase shift region, the equivalent refractive index also periodically varies due to the diffraction grating layer 2b, and the light of the wavelength satisfying the Bragg reflection condition is fedback. Since the refractive index of the diffraction grating layer 2b is larger than that of the cladding layer 6 on both sides of the phase shift region, the average equivalent refractive index is larger than the equivalent refractive index of the phase shift region and the propagation constant of light is smaller than that of the phase shift region. If the length $l_s$ is chosen so that $\Delta\beta l_s = \pi/2$, where $\Delta\beta$ is a difference in the propagation constant, the light which has received distributed feedback at the opposite sides of the phase shift region is shifted by $\pi/2$, and the laser oscillates at a single wavelength. Herein, the equivalent refractive index is determined by the composition and thickness of the respective layers. Although the thickness control during crystalline growth on a plane is good, the control of etching depth is quite difficult or impossible, especially when etching a fine pattern structure such as a diffraction grating pattern. Contrary to the prior art example, the thickness of the guiding layer 12 is strongly affected by the diffraction grating configuration. In the present embodiment, the average thickness of the diffraction grating layer 2b is not likely to be affected by the diffraction grating configuration, and, therefore, the equivalent refractive index of the respective regions can be precisely controlled. Therefore, the phase shift quantity can be established at a design value with high reproducibility.

Figure 5A:
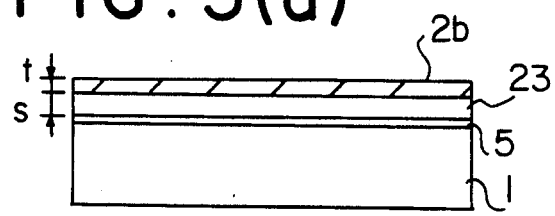
FIGS. 5(a) to 5(e) are sectional views of an alternative third embodiment.
Figure 5B:
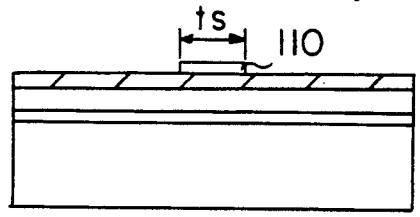
Figure 5C:
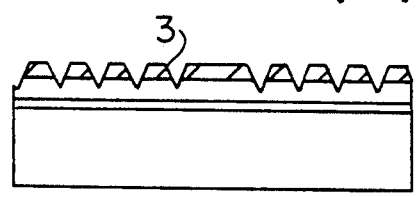
Figure 5D:
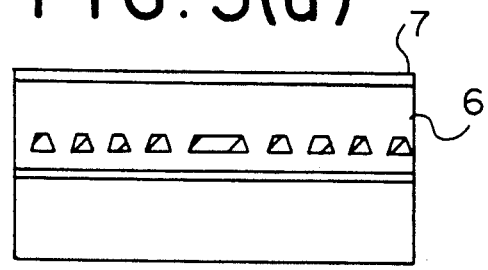
Figure 5E:
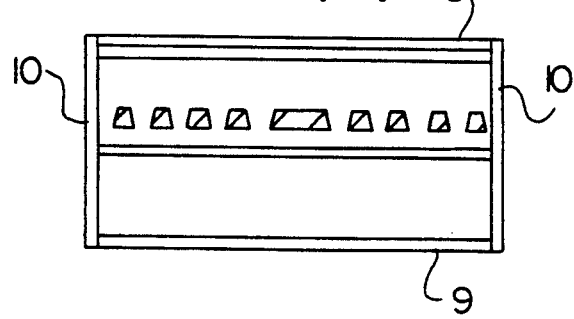

FIG. 5(e) shows a phase shift DFB type semiconductor laser device and FIGS. 5(a) to 5(d) show a production process therefor according to an alternative third embodiment. In these figures, the same reference numerals designate the same or corresponding elements as those shown in FIGS. 4(a) to 4(e).

The same process as that of FIG. 4(a) is carried out in FIG. 5(a), and, thereafter, as shown in FIG. 5(b), a silicon dioxide film 110 is deposited at the phase shift region to prevent etching of the diffraction grating of that region. The interference fringe illumination method and chemical etching are carried out to produce a distributed feedback diffraction grating 3, as shown in FIG. 5(c). Thereafter, as shown in FIG. 5(d), the same process as that of FIG. 4(d) is carried out, thereby completing the element shown in FIG. 5(e).

In this alternative structure, the equivalent refractive index of the phase shift region is larger than the average equivalent refractive index of the regions on both sides thereof, but the phase shift arises from the difference in the propagation constant, and the same effects as that of the embodiment of FIG. 3(d) are obtained.

FIGS. 6(a) to 6(d) show a production process of a DFB semiconductor laser device according to a fourth embodiment of the present invention, and FIG. 6(e) shows a cross-sectional view of a DFB semiconductor laser device completed through the processes of FIGS. 6(a) to 6(d).

Figure 10:
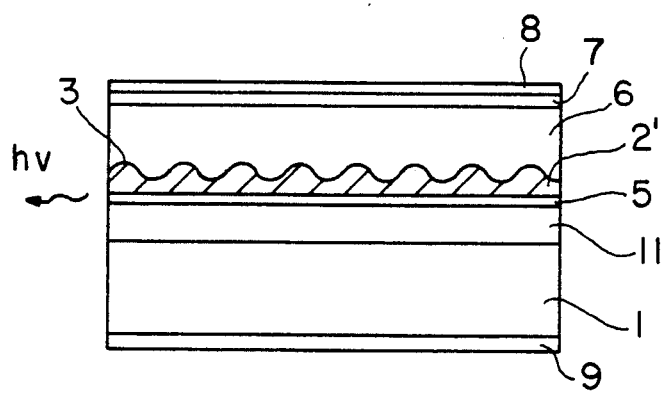
FIGS. 10, 11, and 12 are diagrams showing prior art semiconductor laser devices.

In FIG 6(e), the same reference numerals designate the same or corresponding portions as those of FIG. 10, and reference numeral 3 designates a p type InP barrier layer.

As shown in FIG. 6(a), InGaAsP active layer 5, p type InP barrier layer 23, and p type InGaAsP diffraction grating layer 2b are successively grown on the n type InP substrate 1. Herein, the thickness of the p type barrier layer 23 is s and the thickness of the p type InGaAsP diffraction grating layer 2b is t. Next, as shown in FIG. 6(b), a pattern by a conventional photolithography technique and etching carried out so that a portion of the center of the p type InGaAsP diffraction grating layer 2b has a thickness h. Herein, the region where the etching is not carried out is denoted I and the region where the etching is carried out is denoted II.

As shown in FIG. 6(c), a diffraction grating pattern is produced by the interference fringe illumination method, and, thereafter, etching, such as chemical etching, is carried out to a depth larger than t and smaller than (h+s), thereby producing a distributed feedback diffraction grating 3. Herein, by utilizing selective etching, the depth may be t at region I and h at region II. Thereafter, n type InP cladding layer 6 and p+ type InGaAsP contact layer 7 are grown. Then, since the p type InP barrier layer 23 and the p type InP cladding layer 6 have the same composition, the configuration shown in FIG. 6(d), in which parallel stripes of diffraction grating layer 4 exist in the p type InP layer and the height of the diffraction grating layer 2b is t at the region I and the height of the diffraction grating layer 4 is h at the region II, is obtained.

Finally, a p side electrode 8 and an n side electrode 9 are produced, thereby completing the device shown in FIG. 6(e).

Figure 13:
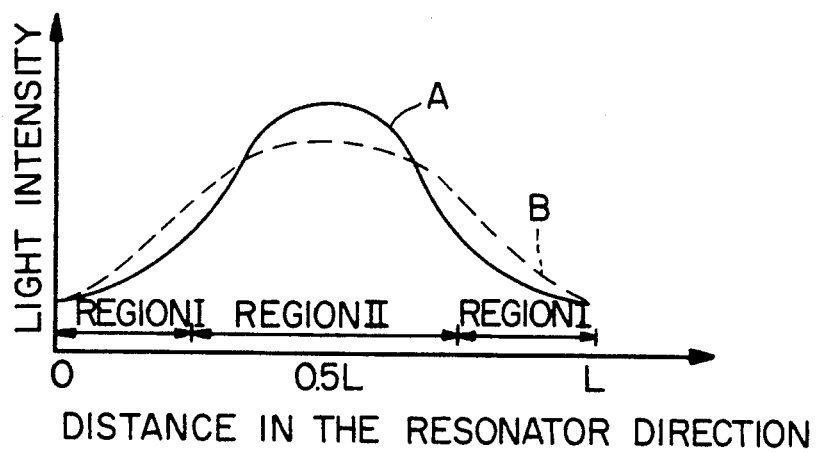
FIG. 13 is a diagram showing light intensity distributions in laser resonators.

When a forward bias is applied between the p side electrode 8 and the n side electrode 9 in a manner similar to the prior art example, carriers are injected into the active layer 5 and recombine to generate light. Since the DFB laser of this embodiment has a waveguide structure similar to the prior art example, the generated light is transmitted in the direction parallel to the active layer 5. Furthermore, if the film thickness s of the barrier layer 23 is so thin that light leaks out of the diffraction grating layer 2b, the light is affected by periodic variations in the equivalent refractive index due to the diffraction grating layer 3, is Bragg reflected, and oscillation occurs. Herein, the coupling coefficient indicating the ratio of the light that is fedback is mainly determined by the distance between the active layer 5 and the diffraction grating 3 and the amplitude of the diffraction grating. In this embodiment, the distance between the active layer 5 and the diffraction grating 3 is determined by the thickness of the barrier layer 23 and become s at both regions I and II. Furthermore, the amplitude of the diffraction grating is determined by the thickness of the diffraction grating layer 2b which is t at region I and h at region II. Thus, even when the etching depth is non-uniform, the amplitude of the diffraction grating can be varied depending on position even if the etching depth is uniform. This result is contrary to that of the prior art in which the etching depth at the time of production of diffraction grating is uniform, resulting in a diffraction grating of uniform amplitude. In the element of this embodiment, t>h and, therefore, the coupling coefficient at region I is larger than that at region II, that is, the coupling coefficient in the neighborhood of the center of the resonator is small and the coupling coefficient in the neighborhood of the facet is large. In such a structure, the light intensity distribution in the cavity has the shape of line B of FIG. 13. As described above, in the prior art example, when the light intensity is increased in the neighborhood of the center of the resonator as shown by line A of FIG. 13, mode instability due to the axial direction spatial hole burning appears at high power output operation. In order to avoid this hole burning, a method of decreasing the coupling coefficient is considered. However, if the coupling coefficient is decreased, the light receiving the distributed feedback is decreased and the threshold gain rises unfavorably, that is, the threshold current rises. In the invention, because the coupling coefficient is increased in the neighborhood of the facet where light intensity is weak and the coupling coefficient in the neighborhood of the center of the element where light intensity is high is decreased, the increase of light intensity in the neighborhood of the element center is prevented without reducing the quantity of light receiving the distributed feedback to an unnecessary extent and the light intensity is uniform in the cavity resonator. Thus, in this embodiment, the modal instability due to the axial direction spatial hole burning is effectively suppressed even at high power output operation and the narrow light width characteristics is enhanced.

In the above-described embodiment, the coupling coefficient is varied by varying the thickness of the p type InGaAsP diffraction grating layer 4, but, as shown in the embodiment of the present invention shown in FIG. 7, it can also be varied by varying the thickness of the p type InP barrier layer 23. Furthermore, the coupling coefficient can be varied by varying the thicknesses of both the diffraction grating layer 2b and the barrier layer 23.

In the above-described embodiment, the coupling coefficient is varied step-wise in two steps but can be varied in three or more steps and further can be varied smoothly.

Although, in the above-described embodiment, a DFB laser using a uniform diffraction grating which has no phase shift region has been described, the present invention can be applied to a λ/4 shifted DFB laser having a diffraction grating in which the phase is shifted by λ/4 wavelength in the neighborhood of the center of the resonator. Then, the invention is quite effective because in the λ/4 shifted DFB laser the light intensity is more likely to be concentrated in the neighborhood of the center of the resonator than in the usual DFB laser.

Furthermore, if the coupling coefficient is intensified not in the neighborhood of both facets but only in the neighborhood of one facet, a laser providing a large light output from the other facet can be made. In this way, the coupling coefficient can be controlled in the resonator and the freedom in the design of the DFB laser is increased.

Figure 8A:
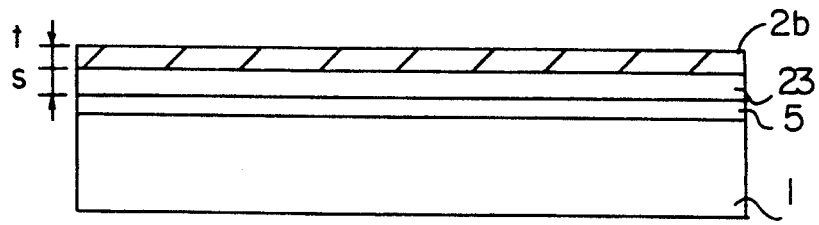

FIGS. 8(a) to 8(d) show a production process of a semiconductor laser according to a fifth embodiment of the present invention, and FIG. 8(e) shows a cross-sectional view of the semiconductor laser device completed through the processes of FIGS. 8(a) to 8(d). In these figures, the same reference numerals designate the same or corresponding elements as those shown in FIG. 14. Reference numeral 23 designates a p type InP barrier layer, reference numeral 2b designates a p type InGaAsP diffraction grating layer, and reference numeral 26 designates a silicon nitride (SiN ) film produced by electron-cyclotron resonance plasma chemical vapor deposition (hereinafter referred to as ECR-PCVD). Reference numerals 27 and 29 designate photoresist films, and reference numeral 10 designates an anti-reflection film.

As shown in FIG. 8(a), InGaAsP active layer 5, p type InP barrier layer 23, and p type InGaAsP diffraction grating layer 2b are successively grown on the n type InP substrate 1. Herein, the thickness of the p type InP barrier layer 23 is s and the thickness of the p type InGaAsP diffraction grating layer 2b is t.

Figure 8B:
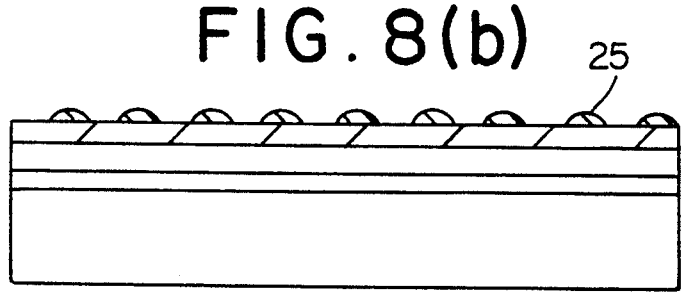

Next, a positive type first photoresist is deposited on the entire surface and a primary diffraction grating pattern is produced by the usual interference fringe method as shown in FIG. 8(b).

Figure 8C:
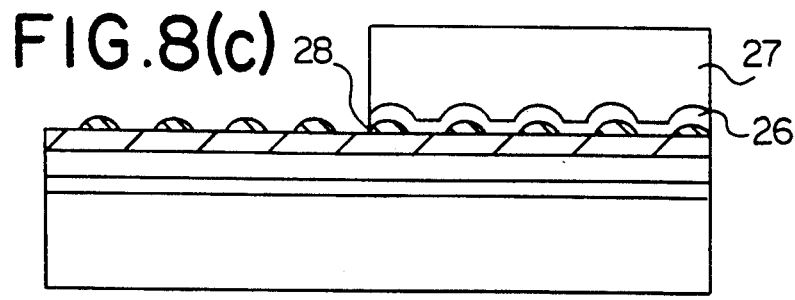
Figure 8D:
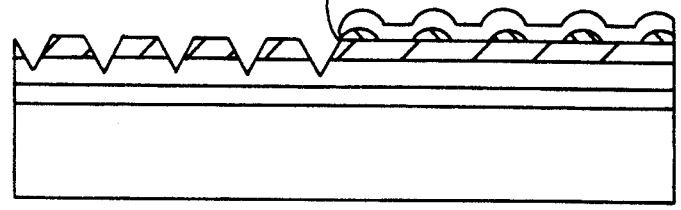

Next, a $SiN_x$ film 26 is deposited by the ECR-CVD method as a coating layer. Since the ECR-CVD method can produce the $SiN_x$ film 26 at a low temperature, production of the coating layer is possible without damaging the photoresist 25. A second photoresist film 27 is produced on the right side of the λ/4 shift position 28 by conventional photolithography techniques. The $SiN_x$ film 26 at the left side of the λ/4 shift position 28 is etched using the second photoresist film 27 as an etching mask, as shown in FIG. 8(c).

Next, using the first photoresist film 25 and the second photoresist film 27 as etching masks, the semiconductor layer is etched to reach the p type InP barrier layer 23 at a depth larger than t and smaller than (t+s). Thereafter, the first photoresist film 25 and the second photoresist film 27 are removed (FIG. 8(d)).

Next, the $SiN_x$ film 26 is etched with buffered hydrofluoric acid. Herein, the $SiN_x$ film 26 produced by the ECR-CVD method has a different etching rate when deposited on the photoresist 25 and when deposited on the substrate 1. The $SiN_x$ film deposited on the photoresist 25 is etched faster than that produced on the substrate 1. By utilizing this characteristic, the $SiN_x$ film 26 on the photoresist film 25 is removed by etching and the $SiN_x$ film 26 on the substrate 1 is left. Thereafter, the photoresist film 25 is removed to produce the configuration shown in FIG. 8(e).

The left side of the λ/4 shift position 28 is coated with a third photoresist film 29, and the above-described $SiN_x$ film 26 and the photoresist film 29 which are used as etching masks for etching the semiconductor layer reach the p type InP barrier layer 23, i.e., to a depth of larger than t and smaller than (t+s) (FIG. 8(f).

Thereafter, the third photoresist film 29 and the SiN$_x$ film 26 are removed to produce the configuration shown in FIG. 8(g), and a diffraction grating configuration in which the phase is inverted at the left and right sides of the λ/4 shift position 28 is obtained.

Finally, the p type InP cladding layer 6 and the p+ type InGaAsP contact layer 7 are regrown and a p side electrode 8 and an n side electrode 9 are produced. Thereafter, an antireflection film 10 is deposited, thereby completing the device.

Similar to the prior art device, when a forward bias is applied between the p side electrode 8 and the n side electrode 9, carriers are injected into the active layer 5 where they recombine and generate light. Since the semiconductor laser device of this embodiment has a waveguide structure similar to the prior art example, the generated light transits in the direction parallel to the active layer 5. If the thickness s of the p type InP barrier layer 23 is sufficiently thin that light leaks out of the diffraction grating, the light is diffracted because variations of the equivalent refractive index due to the diffraction grating layer 2b and is Bragg reflected. Then, because the phases of the light which have received the Bragg reflection are different from each other by π/2 to the left and right of the λ/4 shift position 28, the laser oscillates at a single wavelength.

Herein, the coupling coefficient indicating the ratio of the light that receives the distributed feedback is mainly determined by the distance between the active layer 5 and the diffraction grating and the amplitude of the diffraction grating. In the device of this embodiment, the distance between the active layer 5 and the diffraction grating is determined by the thickness s of the barrier layer 23 and the amplitude of the diffraction grating is determined by the thickness t of the diffraction grating layer 2b. These distances do not depend on the etching depth and the etching configuration at the time of production of the diffraction grating, as in the prior art example. Therefore, even if etching of the diffraction grating is carried out in two steps to the left and right of the λ/4 shift position 28, the coupling coefficients can be equal at both the left and right of the λ/4 shift position. Furthermore, by controlling the thicknesses of the p type InP barrier layer 23 and the p type InGaAsP diffraction grating layer 2b, the reproducibility of element characteristics is enhanced.

In the above-described embodiment, a SiN$_x$ film 26 deposited by the ECR-CVD method is used as the coating layer, but any fabrication method of the SiN$_x$ film 26 which does not damage the resist film 25 can be employed. For example, a coating layer which will not be dissolved by a solvent removing the resist film 25 can be employed.

In the above-described embodiment, buffered hydrofluoric acid is used for etching the SiN$_x$ film, but dry etching may be used for this etching step.

Figure 9A:
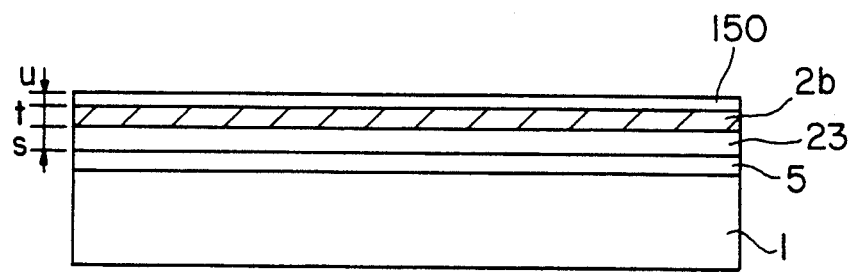
FIGS. 9(a) and 9(b) are sectional views of an alternative fifth embodiment.
Figure 9B:
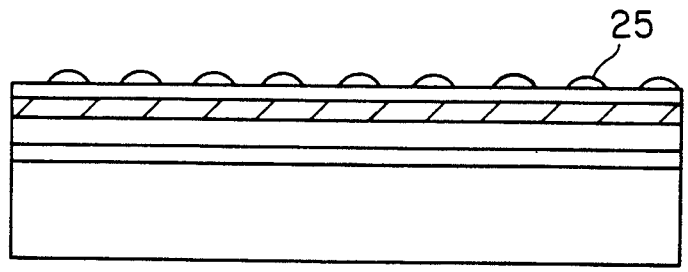

FIGS. 9(a) and 9(b) show a process for producing a semiconductor laser device according to an alternative to this fifth embodiment. In FIG. 9(a), reference numeral 150 designates a p type InP deformation preventing layer that is grown on the diffraction grating layer 2b to a thickness u. In the production process of this alternative embodiment, by carrying out the same processes as those shown in FIGS. 8(a) to 8(g) (however, the etching depth of the diffraction grating is larger than (u+t) and smaller than (u+t+s)), a structure similar to FIG. 8(h) is obtained. By providing a p type InP deformation preventing layer 150, the etching at the time of production of the diffraction grating and deformation of the diffraction grating at the regrowth do not affect the coupling coefficient.

In the above embodiment, a semiconductor laser device is described but the principle of the present invention can be applied to an element utilizing a grating such as a wavelength variable DFB filter with the same effects.

In the above embodiments, a DFB semiconductor laser device utilizing a conductive n type InP substrate is described, but the present invention may be applied to a device utilizing a semi-insulating InP substrate or a p type InP substrate. Furthermore, the present invention may be applied to a device utilizing other materials, such as GaAs series materials.

In the above embodiments, a semiconductor laser device is described, but the present invention may be applied to other elements utilizing a diffraction grating, such as a distributed Bragg reflection semiconductor laser, a distributed reflection type semiconductor laser, a waveguide type grating filter, or a reflection type grating deflection element.

As is evident from the foregoing description, according to an aspect of the present invention, a first semiconductor layer having a larger energy band gap than the active layer, a diffraction grating layer having a larger energy band gap than the active layer and a smaller energy band gap that the first semiconductor layer, and a second semiconductor layer of the same composition as the first semiconductor layer are successively disposed on the active layer. Thereafter, a cladding layer of the same composition as the first semiconductor is regrown, and a diffraction grating comprises the remainder of the diffraction grating layer.

While the coupling coefficient of light is mainly determined by the distance between the active layer and the diffraction grating and the amplitude of the diffraction grating, the distance between the active layer and the diffraction grating is determined by the thickness of the barrier layer which has of the same composition as the semiconductor substrate disposed between the diffraction grating layer and the active layer. The amplitude of the diffraction grating is determined by the thickness of the diffraction grating layer. Therefore, the coupling coefficient can be precisely established at a design value.

What is claimed is:

1. A semiconductor laser device comprising:
a semiconductor substrate of a first conductivity type;
a semiconductor first cladding layer of the first conductivity type disposed on said substrate;
an active layer disposed on said first cladding layer;
a first semiconductor layer of a second conductivity type opposite the first conductivity type having a larger energy band gap than said active layer, a discontinuous semiconductor diffraction grating layer of the second conductivity type having a larger energy band gap than said active layer and a smaller energy band gap than said first semiconductor layer, and a second semiconductor layer of the second conductivity type having the same composition as said first semiconductor layer successively disposed on said active layer, said second semiconductor layer extending through said discontinuous diffraction layer to said first semiconductor layer at periodically disposed parallel grooves extending through said diffraction grating and second semiconductor layers to said first semiconductor layer;

a semiconductor second cladding layer having the same composition as said first semiconductor layer and of the second conductivity type disposed on said second semiconductor layer;

a semiconductor contact layer of the second conductivity type disposed on said second cladding; and first and second electrode disposed on said substrate and said contact layer, respectively.

2. A semiconductor laser device as defined in claim 1 wherein said substrate and said third semiconductor layer comprise InP, said active layer comprises InGaAsP, said first and second semiconductor layers comprise InP, and said diffraction grating layer comprises InGaAsP.

3. A semiconductor laser device comprising:
a semiconductor substrate;
a discontinuous diffraction grating layer comprising a semiconductor having a smaller energy band gap than said semiconductor substrate disposed on said semiconductor substrate, periodically disposed parallel grooves extending through said discontinuous diffraction grating layer to said substrate;
a semiconductor barrier layer having the same composition as said semiconductor substrate disposed on said discontinuous diffraction grating layer and on said substrate in the grooves;
a semiconductor active layer having a smaller energy band gap than said discontinuous diffraction grating layer disposed on said barrier layer;
a semiconductor cladding layer having a larger energy bank gap than said active layer disposed on said active layer;
a semiconductor contact layer disposed on said cladding layer; and
first and second electrodes disposed on said substrate and said contact layer, respectively.

4. A semiconductor laser device as defined in claim 3 wherein said substrate and said barrier layer comprise first conductivity type InP, said active layer comprises InGaAsP, said cladding layer comprises second conductivity type InP, and said diffraction grating layer comprises second conductivity type InGaAsP.

5. A semiconductor laser device as defined in claim 3 including a deformation preventing layer having the same composition as said semiconductor substrate disposed on said discontinuous diffraction grating layer.

6. A semiconductor laser device comprising:
a semiconductor substrate;
an active layer disposed on said semiconductor substrate;
a barrier layer having a larger energy band gap than said active layer and a diffraction grating layer having a larger energy band gap than said active layer and a smaller energy band gap than said barrier layer successively disposed on said active layer, a portion of said diffraction grating layer being absent from said barrier layer, the remainder of said diffraction grating layer being discontinuous and including a plurality of periodically disposed parallel grooves extending through said diffraction grating layer into said barrier layer;

a semiconductor cladding layer of the same composition as said barrier layer disposed on said diffraction grating layer and on said barrier layer in the grooves and where said diffraction grating layer is absent;

a semiconductor contact layer disposed on said cladding layer; and first and second electrodes disposed on said substrate and said contact layer, respectively.

7. A semiconductor laser device as defined in claim 6 wherein said semiconductor substrate has a larger energy band gap than said active layer and a conductivity type opposite that of said barrier layer.

8. A semiconductor laser device as defined in claim 7 wherein said substrate comprises first conductivity type InP, said active layer comprises InGaAsP, said barrier layer and said cladding layer comprise second conductivity type InP, and said diffraction grating layer comprises second conductivity type InGaAsP.

9. A semiconductor laser device comprising:
a semiconductor substrate;
an active layer disposed on said semiconductor substrate;
a barrier layer having a larger energy band gap than said active layer and a diffraction grating layer having a larger energy band gap than said active layer and a smaller energy band gap than said barrier layer successively disposed on said active layer, said barrier layer having a varying thickness between said active layer and said diffraction grating layer, said diffraction grating layer being discontinuous and including a plurality of periodically disposed parallel grooves extending through said diffraction grating layer into said barrier layer;
a semiconductor cladding layer of the same composition as said barrier layer disposed on said diffraction grating layer and on said barrier layer in the grooves and where said diffraction grating layer is absent;
a semiconductor contact layer disposed on said cladding layer; and
first and second electrodes disposed on said substrate and said contact layer, respectively.

10. A semiconductor laser device as defined in claim 9 wherein said semiconductor substrate has a larger energy band gap than said active layer and a conductivity type opposite that of said barrier layer.

11. A semiconductor laser device as defined in claim 10 wherein said semiconductor substrate comprises first conductivity type InP, said active layer comprises InGaAsP, said barrier layer and said cladding layer comprise second conductivity type InP, and said diffraction grating layer comprises second conductivity type InGaAsP.

* * * * *